United States Patent [19]
Tamaki et al.

[11] Patent Number: 6,163,150
[45] Date of Patent: Dec. 19, 2000

[54] MAGNETIC FIELD SENSOR

[75] Inventors: Naoya Tamaki; Norio Masuda, both of Tokyo; Masahiro Yamaguchi; Kenichi Arai, both of Miyagi, all of Japan

[73] Assignee: NEC Corporation, Tokyo, Japan

[21] Appl. No.: 09/396,731

[22] Filed: Sep. 15, 1999

[30] Foreign Application Priority Data

Dec. 4, 1998 [JP] Japan .................................. 10-345772

[51] Int. Cl.$^7$ ................................................ G01R 33/02
[52] U.S. Cl. .......................................... 324/258; 324/260
[58] Field of Search .................................. 324/249, 252, 324/260, 262; 338/32 R; 360/113

[56] References Cited

U.S. PATENT DOCUMENTS 4,913,152   4/1990   Ko et al. .............................. 128/653 R

Primary Examiner—Christine Oda
Assistant Examiner—Henry S. Andersen
Attorney, Agent, or Firm—McGinn & Gibb, PLLC

[57] ABSTRACT

A magnetic field sensor is provided which can be easily downsized and has a capability to detect a magnetic field in the Ghz band with a high space resolution and to reduce a voltage induced by an electric field. The magnetic field sensor is composed of a first layer, a second layer and a third layer. The first layer is provided with a straight-lined conductor pattern disposed in a perpendicular manner to a mid-point of another straight-lined conductor pattern being the longest among J-shaped conductor patterns. The third layer has the same conductor pattern as the first layer. The second layer has a ladle-shaped conductor pattern disposed along the center of the width of the conductor pattern of the first layer and third layer and an L-shaped conductor pattern disposed so as to form a loop face to face with the bending section of the J-shaped conductor pattern. One end of the L-shaped conductor pattern is connected to the ladle-shaped conductor pattern and the other end is connected to end points of the straight-lined conductor patterns that are the longest among the J-shaped conductor patterns of the first layer and third layer.

3 Claims, 5 Drawing Sheets

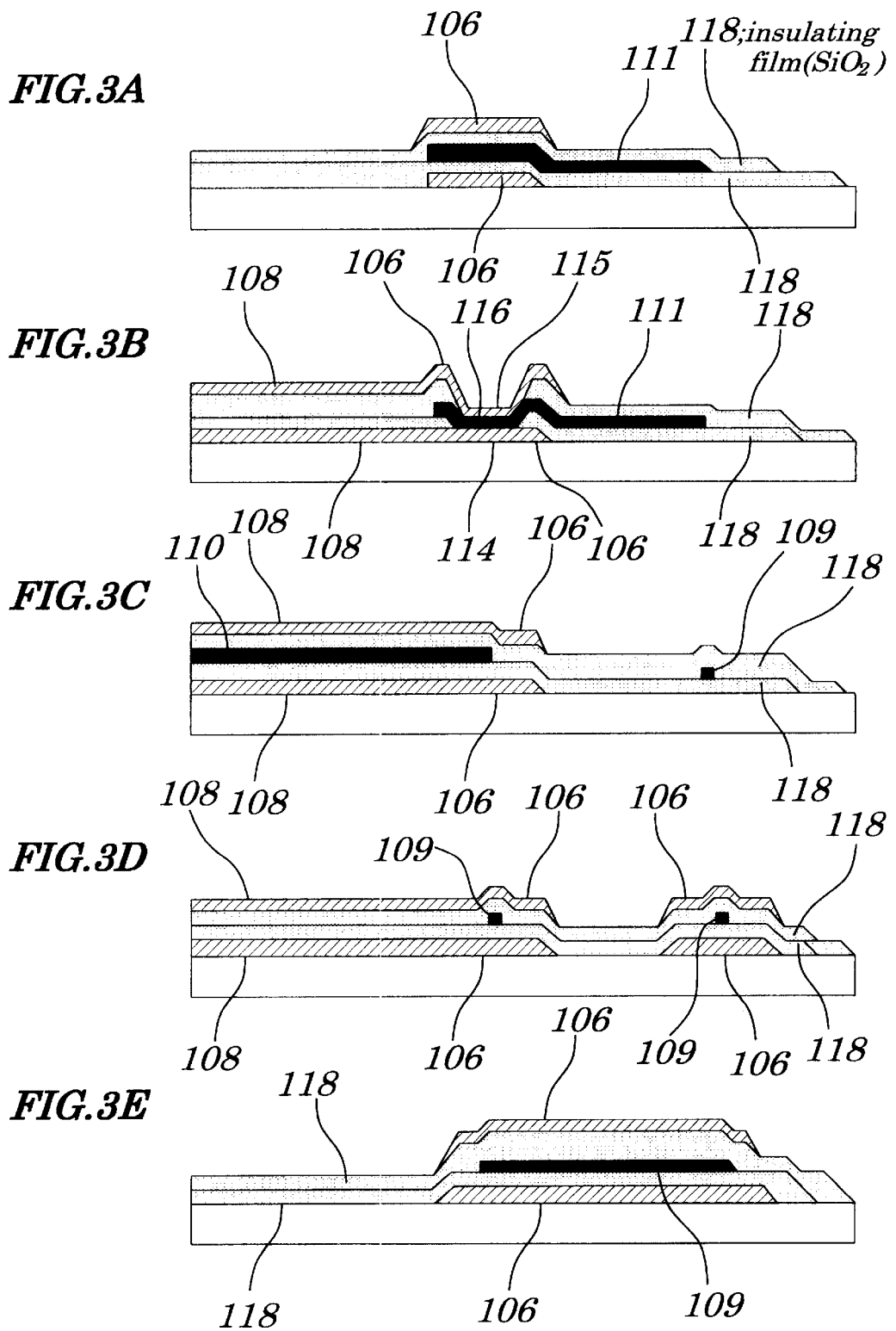

MAGNETIC FIELD SENSOR

BACKGROUND OF THE INVENTION

1. Field of the Invention

The present invention relates to a magnetic field sensor to measure a magnetic field from a magnetic field source.

2. Description of the Related Art

As a conventional magnetic field sensor, a shielded loop-type magnetic field sensor fabricated by processing a semi-rigid coaxial cable is used. The conventional magnetic sensor is excellent in electric shield characteristics. As shown in FIG. 5, in the conventional one, the semi-rigid coaxial cable 31 is configured so as to form a loop. A loop terminating point 32 of the coaxial cable 31 is connected to a loop starting point 37 of the coaxial cable 31 to establish a short circuit or the loop is terminated to be non-reflective. In the lowest portion of the loop in FIG. 5, a space 34 is formed with only a central conductor 33 left therein. At a portion 35 on the loop terminating point 32 of the space 34, a short circuit is established between the central conductor 33 and an external conductor. When the shielded loop magnetic sensor is put in a magnetic field, according to Faraday's law, a voltage can be obtained as a detected magnetic field output depending on a change with time in the magnetic field which links on a loop face 36.

When a magnetic field is to be measured by a source generating a magnetic field to be measured by a conventional magnetic field sensor, if there is another magnetic field generating source or a surrounding noise in its proximity, the downsizing of the magnetic sensor is required to raise a space resolution so that only a magnetic field produced by a magnetic field generating source to be targeted can be measured, however, there is a limit to the realization of downsizing of the magnetic field sensor from a structure viewpoint.

As a problem presented in an attempt to downsize the sensor, a reduction occurs in its characteristics caused by breaking of a wire of a central conductor of the semi-rigid coaxial cable constituting the magnetic field sensor or by deformation of an insulator. If it is difficult to downsize the magnetic sensor, due to problems related to self-inductance (which can be controlled by the downsizing of the magnetic sensor) or self resonance, the upper limit of a frequency band is confined to about 1 GHz. Accordingly, it is difficult to measure a magnetic field being induced by a clock signal having a high frequency component in the vicinity of, for example, LSI and MMIC.

Moreover, the attempt to downsize the shielded loop magnetic field sensor has not been made.

Also, the magnetic field sensor fabricated by using a conventional semi-rigid coaxial cable has a shortcoming that it is of low manufacturing accuracy and not suitable for volume production.

SUMMARY OF THE INVENTION

In view of the above, it is an object of the present invention to provide a magnetic field sensor which can be easily downsized and has a capability to detect a magnetic field in the GHz band with a high space resolution and to reduce a voltage induced by an electric field.

According to one aspect of the present invention, there is provided a magnetic field sensor comprising a first layer, a second layer and a third layer each being stacked, in order, with an insulating layer interposed therebetween;

whereby the first layer having a J-shaped conductor pattern and a straight-lined conductor pattern with its sectional shape being approximately rectangular and with a predetermined width, with the straight-lined conductor pattern perpendicular to the long, straight staff of the J-shaped conductor pattern at the midpoint of the straight edge of the staff that is continuous with the outer edge of the hook-shaped portion of the J;

the third layer having the same conductor pattern as the first layer;

the second layer having a ladle-shaped pattern with a predetermined width of the conductor pattern being slender than those of the first and third layers, disposed along the center of the width of the conductor pattern of the first and third layers consisting of the J-shaped conductor pattern and the straight-lined conductor pattern and a L-shaped conductor pattern with the approximately same width of the conductor as the J-shaped conductor pattern, disposed face to face with the J-shaped conductor pattern to form a loop;

one end of the L-shaped conductor pattern being connected to the ladle-conductor pattern and the other end of the L-shaped conductor pattern being connected to an end point disposed in the long, straight staff of the J-shaped conductor pattern of the first and third layers, near the end of the staff furthest from the hook-shaped portion of the J;

shapes of the J-shaped conductor pattern and the L-shaped conductor pattern projected on a plane being symmetrical about the mid-point of the straight-lined conductor pattern; and a voltage generated on load between the conductor pattern of the second layer and the conductor pattern of the first and third layers being detected and being used as a magnetic field output.

In the foregoing, a preferable mode is one wherein the second layer conductor pattern, together with the conductor pattern of the first layer and third layer disposed at both sides of the second layer constitute a three layer structure strip line and wherein a characteristic impedance of the strip line is matched to that of the measuring system used to fetch the magnetic field output.

Also, a preferable mode is one wherein the characteristic impedance of said strip line is set to be 50 ohms.

BRIEF DESCRIPTION OF THE DRAWING

The above and other objects, advantages and features of the present invention will be more apparent from the following description taken in conjunction with the accompanying drawings, in which:

FIGS. 3A to 3E are cross-sectional views of the magnetic field sensor taken along the line ①–⑤ shown in FIG. 2D;

DETAILED DESCRIPTION OF THE PREFERRED EMBODIMENTS

Figure 1A:
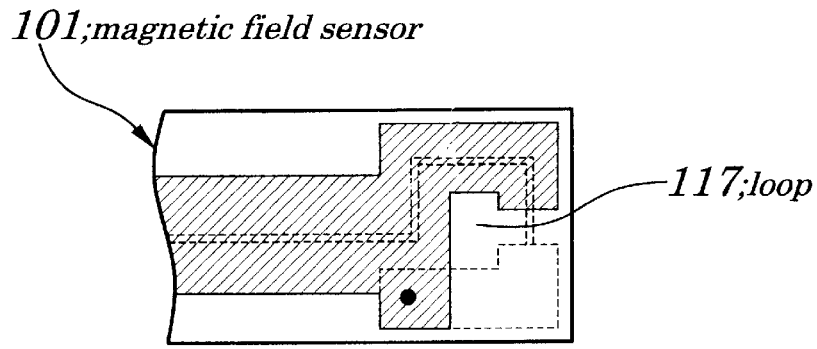
FIG. 1A is a schematic diagram of a magnetic field sensor according to one embodiment of the present invention and FIG. 1B is a schematic diagram of the same magnetic field sensor which is divided into each conductor pattern for clarification purpose.

Best modes of carrying out the present invention will be described in further detail using various embodiments with reference to the accompanying drawings.

FIG. 1 is a schematic diagram of a magnetic field sensor according to one embodiment of the present invention in which the magnetic field sensor 101 is divided into each conductor pattern for clarification purpose. FIGS. 2A, 2B and 2C show top views of conductor patterns of a first layer 102, a second layer 103 and a third layer 104, respectively, each constituting the magnetic field sensor 101. FIG. 2D is a projection drawing of the magnetic field sensor 101 in which the first layer 102, second layer 103 and third layer 104 are superposed upon one another. FIGS. 3A to 3E are cross-sectional views of the magnetic field sensor taken along the line ①–⑤ shown in FIG. 2D. FIGS. 4A to 4D are cross-sectional views of the magnetic field sensor taken along the line ⑥–⑨ shown in FIG. 2D.

The magnetic field sensor shown in FIGS. 1A to 4D is configured so as to have a three-layer structure strip line, having the first layer 102 equipped with an external conductor to be used as a ground terminal, the third layer 104, and the second layer 103 disposed between these first and third layers and equipped with a center conductor to be used as a signal line.

The first layer 102 is provided with an approximately J-shaped conductor pattern 106 composed of three straight-lined conductors and with a straight-lined conductor pattern 108 having a rectangular sectional shape and a predetermined width. The straight-lined conductor 108 is disposed perpendicular to the long, straight staff 107 of the J-shaped conductor pattern 106 at the midpoint of the straight edge of the staff that is continuous with the outer edge of the hook-shaped portion of the J.

The third layer 104 has the same conductor pattern as the first layer 102.

The second layer 103 has a ladle-shaped conductor pattern, having a predetermined width, composed of an ⊃-shaped conductor pattern 109 and of a straight-lined conductor pattern 110 and a L-shaped conductor pattern 111 connected to one end of the ⊃-shaped conductor pattern 109 with the straight-lined pattern 110 connected to the other end of the ⊃-shaped conductor pattern 109. The above ladle-shaped conductor pattern is a pattern being more slender than those of the first layer 102 and third layer 104 and being disposed along the center of the width of each of the bending section of the J-shaped conductor pattern 106 and the straight-lined conductor pattern 108. Moreover, the L-shaped conductor pattern 111 has the approximately same width as the J-shaped conductor patterns 106 of the first layer 102 and third layer 104 and forms a loop face to face with the bending section of the J-shaped conductor pattern 106 when the first layer 102 and third layer 104 are superposed upon one another.

To end points 114 and 115 of the straight-lined conductor 107 of the J-shaped conductor pattern 106 of the first layer 102 and the third layer 104 is electrically connected the other end point 116, near the end of the L-shaped conductor pattern 111 furthest from the ⊃-shaped conductor pattern 109 on the second layer 103.

As shown in FIG. 2D, an outer portion 112 of the conductor pattern, when the first layer 102, second layer 103 and third layer 104 are superposed on one another, is symmetrical in the right and left directions to a center line 113 of the magnetic field sensor 101.

As shown in FIGS. 3A through 4D each layer is grown on a silicone substrate or glass substrate by sputtering. A pattern of each layer is formed by wet etching or dry etching after the masking of Al/Ti/Cu/Ti layers. Then, each layer is stacked through an insulating layer ($SiO_2$). Thus, the magnetic field sensor of the present invention is fabricated by a semiconductor production process technology. The layers of the first layer 102 to third layer 104 are stacked through insulating film 118 having the same thickness and the same materials ($SiO_2$).

The straight-lined conductor patterns 108 of the first layer 102 and the third layer 104 have the largest width and the J-shaped conductor patterns 106 of the first layer 102 and third layer 104 and the L-shaped conductor pattern 111 of the second layer have the next largest width, while the ⊃-shaped conductor pattern 109 of the second layer 103 and the straight-lined conductor pattern 110 have the smallest width.

The sectional shape of the conductor pattern of each layer is almost rectangular.

Figure 1B:
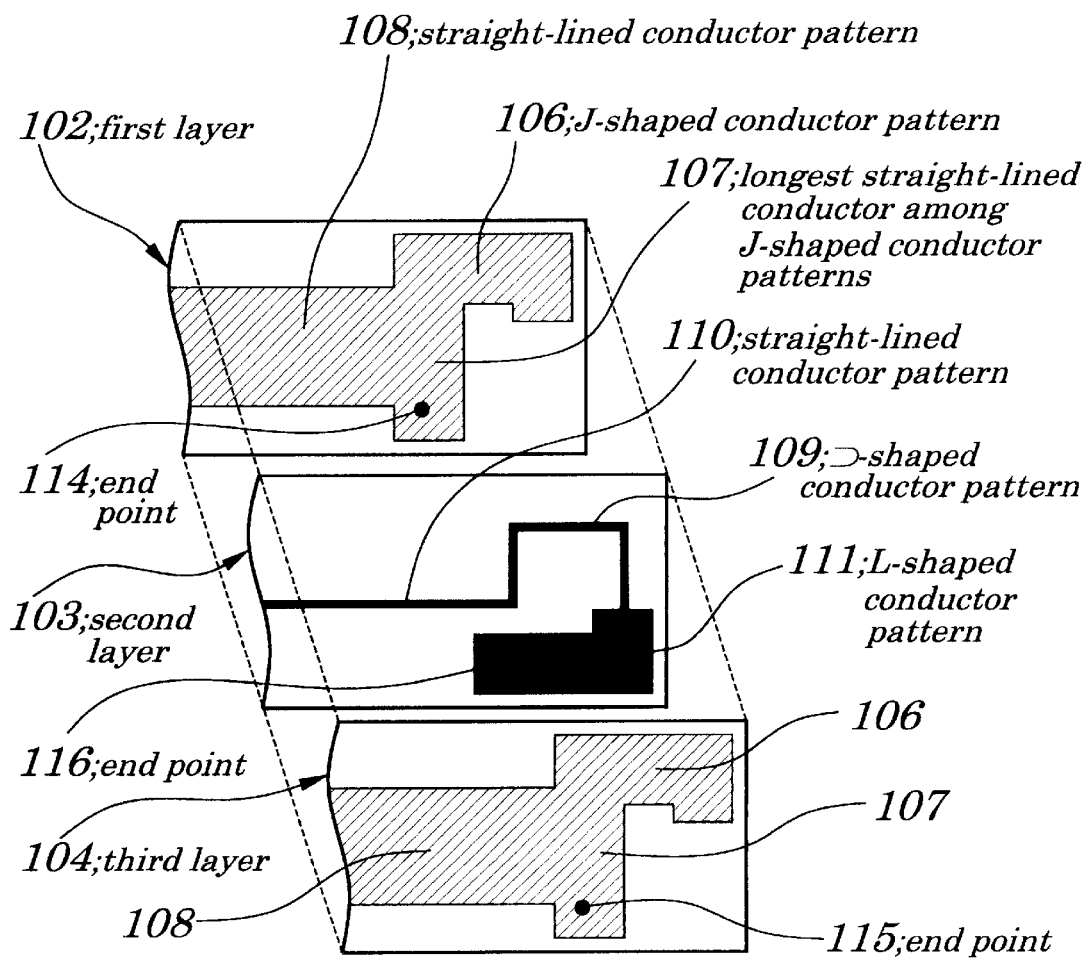
Figure 2A:
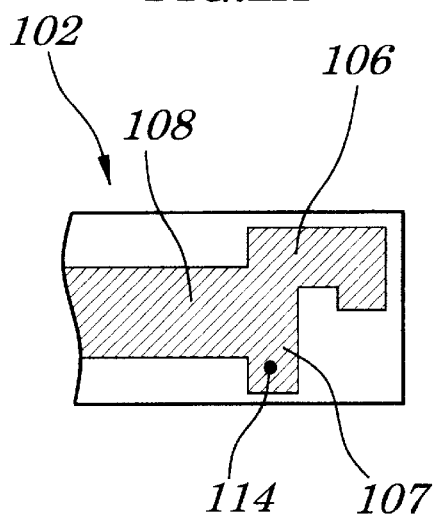
FIGS. 2A, 2B and 2C show top views of conductor patterns of a first layer, a second layer, a third layer, respectively, each constituting the magnetic field sensor
Figure 2B:
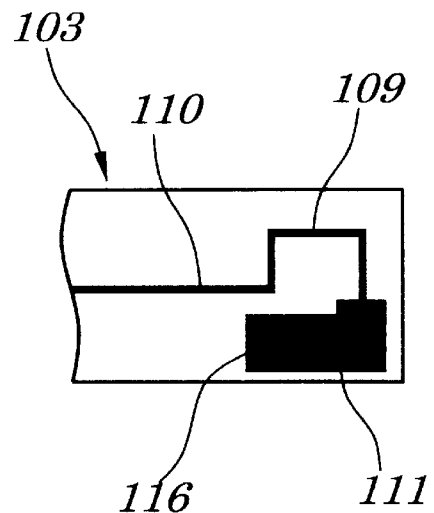
Figure 2C:
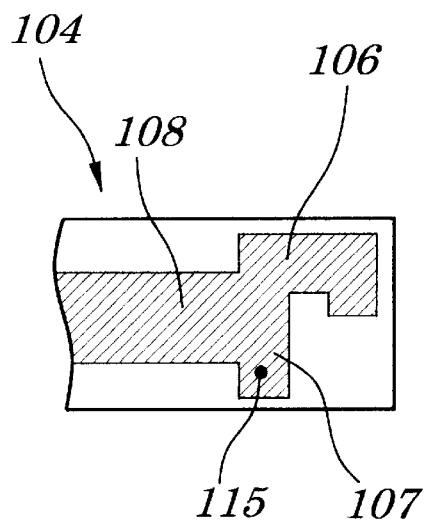
Figure 2D:
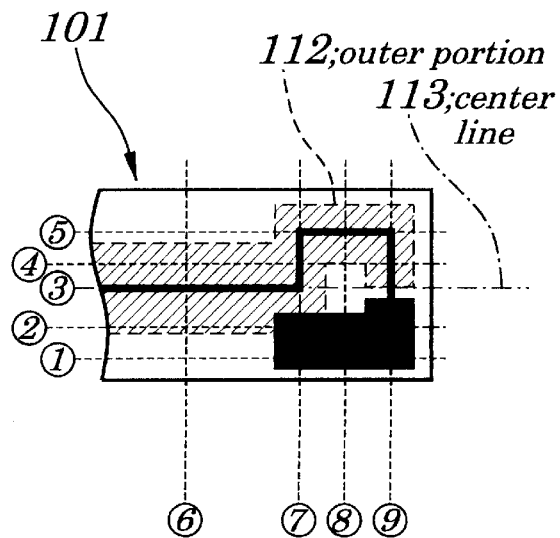
FIG. 2D is a projection drawing of the magnetic field sensor in which the first layer, second layer and third layer are superposed upon one another.
Figure 4A:
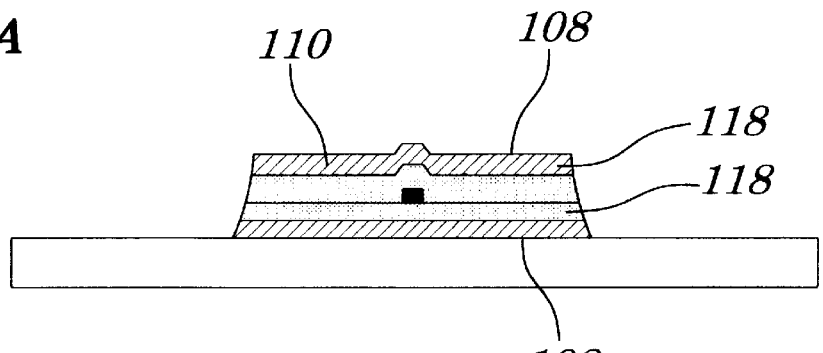
FIGS. 4A to 4D are cross-sectional views of the magnetic field sensor taken along the line ⑥–⑨ shown in FIG. 2D.
Figure 4B:
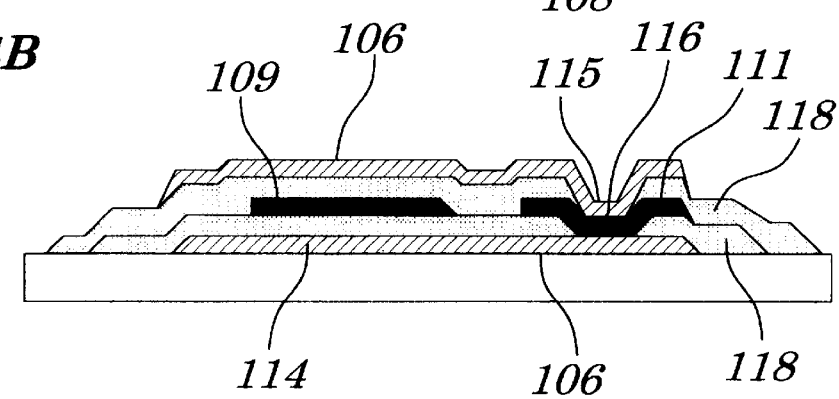
Figure 4C:
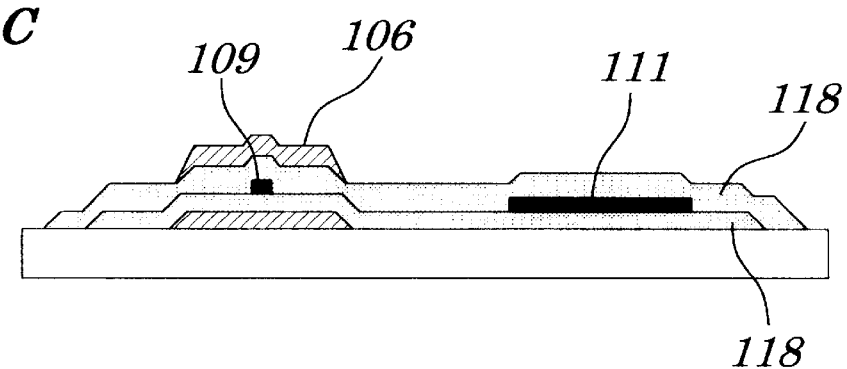
Figure 4D:
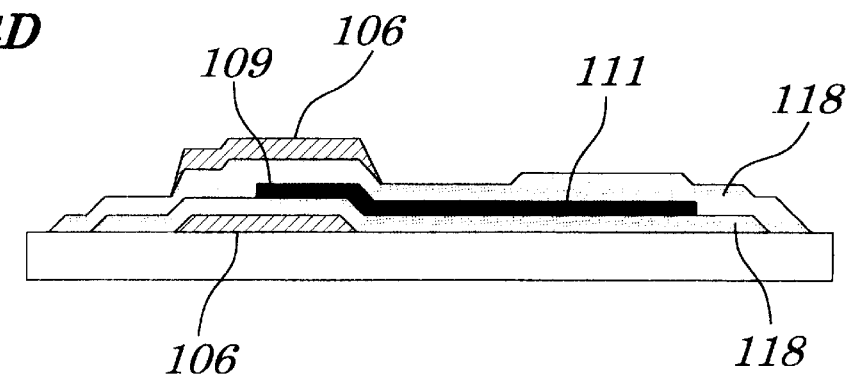
Figure 5:
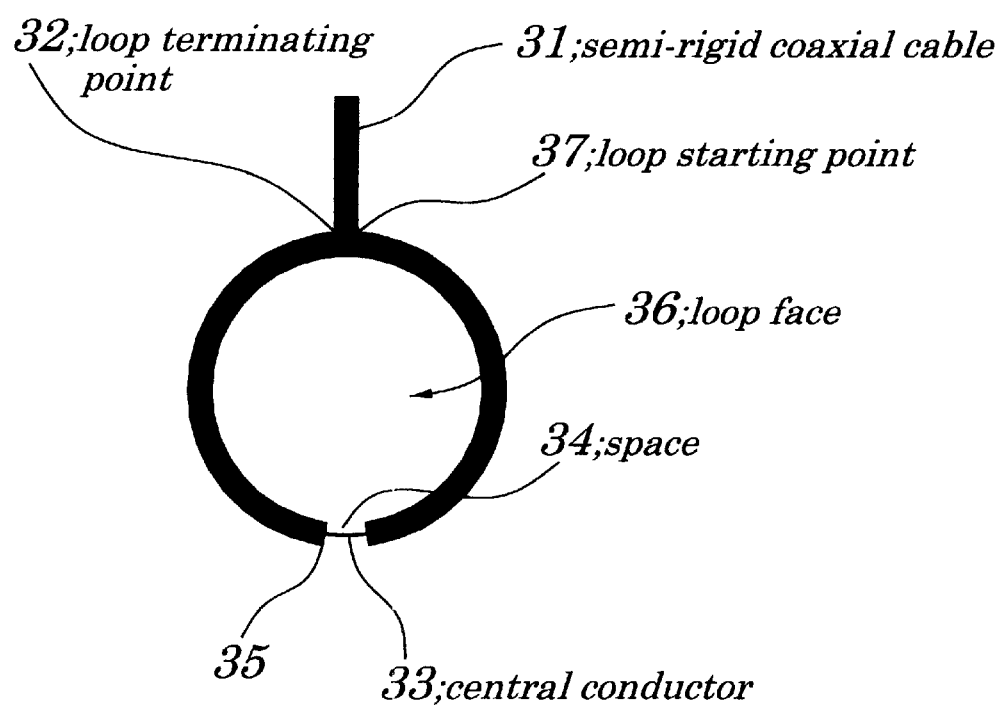
FIG. 5 illustrates a conventional shielded loop magnetic field sensor fabricated by processing a semi-rigid coaxial cable.

Next, referring to FIGS. 1A and 1B, operations of the magnetic field sensor of the present invention are described.

When the magnetic field sensor 101 is put in a magnetic field, according to well-known principles in a loop-type magnetic field sensor, an output voltage "v" corresponding to a magnetic field "H" passing through a loop is generated. The output voltage is given by the following formula (1):

$$v = -\mu S \frac{dH}{dt} \quad (1)$$

where "$\mu$" is magnetic permeability and "S" is an area of a loop 117.

The output voltage is transferred to the leftmost end in the drawing of the magnetic field sensor 101 and the voltage generated across the load connected between the straight-lined conductor pattern 110 of the second layer 103 and the straight-lined conductor pattern 108 of the first layer 102 and third layer 104 is fetched as a detected magnetic field output.

The output can be measured by connecting measuring equipment such as a spectrum analyzer, oscilloscope or the like as a load.

A portion in which the ⊃-shaped conductor pattern 109 and the straight-lined conductor pattern 110 are formed, together with the GND conductor pattern of the first layer 102 and third layer 104 (i.e., a conductor pattern composed of the J-shaped conductor pattern 106 and the straight conductor pattern 108) disposed at both sides of the above portion constitute the three-layer structure strip line. This allows a design of characteristic impedance of the strip line, and by matching the characteristic impedance (for example, 50 ohms) of the strip line to that of measuring systems such as a coaxial cable or measuring equipment used to fetch the output, a reflection loss is reduced, thus enabling an efficient transfer of the detected magnetic field output to the measuring equipment.

Moreover, the use of the strip line makes an electric field effect higher, reducing the voltage induced by an electric field.

Thus, according to the present invention, without processing of the semi-rigid coaxial cable that has been employed in the conventional art, the magnetic field sensor being equivalent to a shielded loop magnetic field sensor, can be configured, by using deposition technology such as etching or sputtering, which can provide the small-sized magnetic field sensor with working accuracy. Accordingly, if there are two or more magnetic field generating sources, because access to a source generating a magnetic field to be measured is possible, an effect by other magnetic field sources can be reduced and only the magnetic field of the source generating the magnetic field to be measured can be measured with high space resolution.

The magnetic field sensor of the present invention, because it uses the strip line, has an electric field effect, thus reducing the voltage induced by an electric field. Furthermore, because the characteristic impedance of the strip line can be designed, reflection loss is reduced and a frequency characteristic in the wide band being usable in the GHz band can be obtained.

Moreover, the downsizing of the sensor makes self-inductance lower, thus preventing the reduction of the sensitivity in high frequency band.

The magnetic field sensor of the present invention, because it is mounted on a semiconductor substrate, can be integrated. If wiring current in the semiconductor circuit is to be monitored, the sensor can be imbedded, in advance, in the proximity of the wiring in the semiconductor circuit, and by transferring its output to the outside, a current of the wiring within the semiconductor can be measured.

Also, the magnetic field sensor of the present invention can be used as a microscopic magnetic field generator by using its reversibility. This allows the magnetic field sensor to be used as a magnetic field generator for a test of electromagnetic immunity in the microscopic regions.

As described above, the magnetic field sensor is so configured that, by having the magnetic field linked with a loop formed by the three layer structure strip line, a voltage generated depending on a change with time of the magnetic field can be fetched as a detected magnetic field output. Because the magnetic field sensor of the present invention is of stacked-layer structure, it can be fabricated, with high accuracy, by a semiconductor production process and also can be easily downsized and has a capability to detect a magnetic field in the GHz band with a high space resolution. Furthermore, it has a basic structure, i.e., a well-known shielded loop structure to reduce a voltage induced by an electric field, thus enabling accurate and reliable measurement of the magnetic field targeted.

It is apparent that the present invention is not limited to the above embodiment but may be changed and modified without departing from the scope and spirit of the invention.

Finally, the present application claims the priority based on Japanese Patent Application No. Hei10-345772 filed on Dec. 4, 1998, which is herein incorporated by reference.

What is claimed is:

1. A magnetic field sensor comprising a first layer, a second layer and a third layer each being stacked, in order, with an insulating layer interposed therebetween, wherein said first layer comprises a J-shaped conductor pattern and a straight-lined conductor pattern with its sectional shape being approximately rectangular and with a predetermined width, and with the straight-lined conductor pattern perpendicular to the long, straight staff of the J-shaped conductor pattern at the midpoint of the straight edge of said staff that is continuous with the outer edge of the hook-shaped portion of the J, wherein said third layer has the same conductor pattern as said first layer, wherein said second layer has a ladle-shaped conductor pattern with a predetermined width of the conductor pattern being more slender than those of said first and third layers, disposed along the center of the width of the conductor pattern of said first and third layers consisting of said J-shaped conductor pattern and said straight-lined conductor pattern, and a L-shaped conductor pattern with approximately the same width of the conductor as said J-shaped conductor pattern, disposed face to face with said J-shaped conductor pattern to form a loop, wherein one end of said L-shaped conductor pattern is connected to said ladle-shaped conductor pattern and the other end of said L-shaped conductor pattern is connected to an end point disposed in the long, straight staff of the J-shaped conductor pattern of the first and third layers, near the end of said staff furthest from the hook-shaped portion of the J, wherein shapes of said J-shaped conductor pattern and said L-shaped conductor pattern projected on a plane are symmetrical about the mid-point of said straight-lined conductor pattern, and wherein a voltage generated on a load between the conductor pattern of said second layer and the conductor pattern of said first and third layers is detected and used as a magnetic field output.

2. The magnetic field sensor according to claim 1 wherein said second layer conductor pattern, together with the conductor pattern of said first layer and third layer disposed at both sides of said second layer constitute a three layer structure strip line and wherein a characteristic impedance of said strip line is matched to that of the measuring system used to fetch said magnetic field output.

3. The magnetic field sensor according to claim 2 wherein the characteristic impedance of said strip line is set to be 50 ohms.

* * * * *